(12) United States Patent
Takatsuka et al.

(10) Patent No.: US 6,498,434 B2
(45) Date of Patent: Dec. 24, 2002

(54) PIEZOELECTRIC TRANSFORMER, DRIVER CIRCUIT INCORPORATING THE PIEZOELECTRIC TRANSFORMER, AND LIQUID CRYSTAL DISPLAY APPARATUS INCORPORATING THE DRIVER CIRCUIT

(75) Inventors: Akiteru Takatsuka, Otsu (JP); Takaaki Asada, Moriyama (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 09/836,076

(22) Filed: Apr. 17, 2001

(65) Prior Publication Data

US 2002/0047625 A1 Apr. 25, 2002

(30) Foreign Application Priority Data

Apr. 24, 2000 (JP) .......................... 2000-123215

(51) Int. Cl.$^7$ ................................. H01J 13/46
(52) U.S. Cl. .................. 315/55; 310/314; 310/365
(58) Field of Search ................. 315/55; 310/311, 310/314, 316.01, 317, 318, 319, 320, 365, 366, 367

(56) References Cited

U.S. PATENT DOCUMENTS

| 3,694,674 A | * | 9/1972 | Inoue .................. 174/52.1 |
| 3,836,794 A | * | 9/1974 | Shimizu et al. ........ 310/354 |
| 3,851,194 A | * | 11/1974 | Kawada ................ 310/345 |
| 6,097,132 A | * | 8/2000 | Inoi et al. ............ 310/345 |

FOREIGN PATENT DOCUMENTS

| JP | 11017240 A | * | 1/1999 |
| JP | 11-174976 | | 7/1999 |
| JP | 2000-69759 | | 3/2000 |
| JP | 0200188433 A | * | 7/2000 |

* cited by examiner

Primary Examiner—Don Wong
Assistant Examiner—Thuy Vinh Tran
(74) Attorney, Agent, or Firm—Keating & Bennett, LLP

(57) ABSTRACT

A piezoelectric transformer includes a piezoelectric unit. The piezoelectric unit includes a plurality of driver units divided by at least one groove extending in the longitudinal direction of the piezoelectric unit from one end thereof, and also includes a plurality of generator units, opposing the driver units, divided by at least one groove extending in the longitudinal direction of the piezoelectric unit from the other end thereof. Opposing pairs of the driver units and the generator units constitute a plurality of transformer units. The transformer units differ in length from one another.

16 Claims, 5 Drawing Sheets

DRIVER SECTION    GENERATOR SECTION

FIG. 10
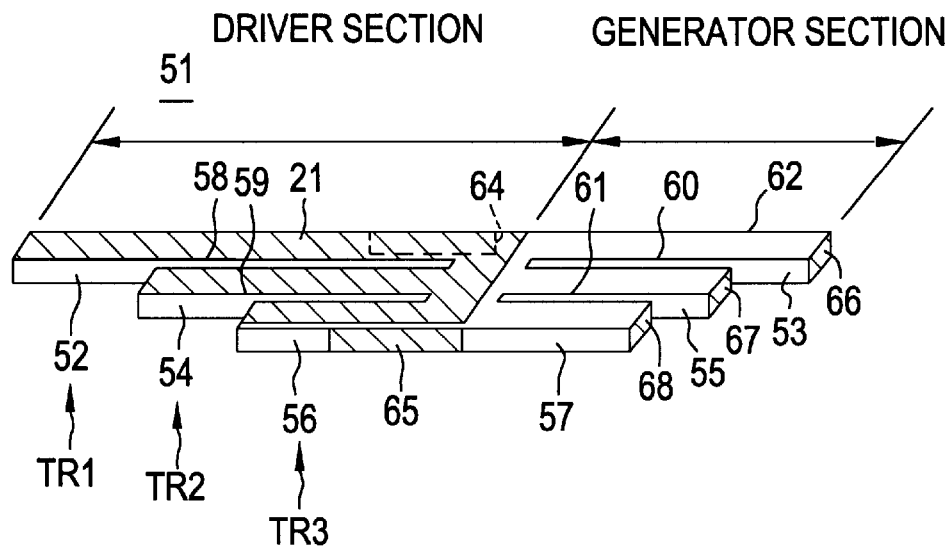
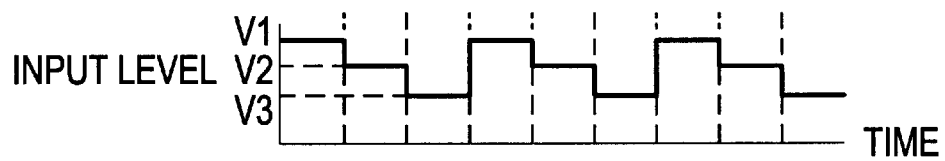
FIG. 11A
FIG. 11B
FIG. 11C
FIG. 11D

PIEZOELECTRIC TRANSFORMER, DRIVER CIRCUIT INCORPORATING THE PIEZOELECTRIC TRANSFORMER, AND LIQUID CRYSTAL DISPLAY APPARATUS INCORPORATING THE DRIVER CIRCUIT

BACKGROUND OF THE INVENTION

1. Field of the Invention

The present invention relates to a piezoelectric transformer, a driver circuit incorporating the piezoelectric transformer, and a liquid crystal display apparatus incorporating the driver circuit.

2. Description of the Related Art

A conventional type of liquid crystal color display apparatus is disclosed in Japanese Unexamined Patent Application Publication No. 11-174976. The liquid crystal color display apparatus disclosed therein requires three inverters corresponding to the three primary colors, so that a backlight provided in the liquid crystal color display is allowed to emit red (R), green (G), and blue (B) light components. Thus, the liquid crystal color display apparatus also includes three transformers respectively corresponding to the three inverters. As a result, the liquid crystal color display apparatus suffers from the problems of increased size and high cost.

SUMMARY OF THE INVENTION

In order to overcome the problems described above, preferred embodiments of the present invention provide a piezoelectric transformer, a driver circuit incorporating the piezoelectric transformer, and a liquid crystal display apparatus incorporating the driver circuit, which has a much smaller size and much lower cost than conventional devices.

According to first preferred embodiment of the present invention, a piezoelectric transformer including a piezoelectric unit is provided. The piezoelectric unit includes a plurality of driver units divided by at least one groove extending in the longitudinal direction of the piezoelectric unit from one end thereof, and also includes a plurality of generator units, opposing the plurality of driver units, divided by at least one groove extending in the longitudinal direction of the piezoelectric unit from the other end thereof. Opposing pairs of the driver units and the generator units constitute a plurality of transformer units. The transformer units differ in length from one another. Thus, the transformer units each have different resonant frequencies.

According to another preferred embodiment of the present invention, a driver circuit for driving a plurality of light sources includes a piezoelectric transformer according to the preferred embodiment described above, in which the plurality of transformer units correspond to the plurality of light sources. The driver circuit also includes a high-frequency generator for applying to the piezoelectric transformer a plurality of drive voltages each having a frequency that is substantially equal to the natural longitudinal resonant frequency of one of the transformer units. Thus, each of the light sources emits light only when the associated transformer unit is resonating.

According to another preferred embodiment of the present invention, a liquid crystal display apparatus includes the driver circuit according to the preferred embodiment defined above, and the plurality of light sources driven by the driver circuit. The liquid crystal display apparatus has a much smaller size and lower cost than conventional devices.

In accordance with various preferred embodiments of the present invention, a plurality of transformer units which differ in length from each other and which each have different resonant frequencies are provided in a single piezoelectric unit, which allows the transformer to have a much smaller size and much lower cost. The transformer incorporating the piezoelectric unit may be used to replace a plurality of transformers. Accordingly, by incorporating the transformer, a driver circuit has a much smaller size and much lower cost. Furthermore, by incorporating the driver circuit, a liquid crystal display apparatus is produced to have a much smaller size and much lower cost.

Other features, elements, characteristics and advantages of the present invention will become more apparent from the following detailed description of preferred embodiments with reference to the attached drawings.

BRIEF DESCRIPTION OF THE DRAWINGS

FIG. 10 is an external perspective view of a piezoelectric transformer in the liquid crystal display apparatus shown in FIG. 9; and FIGS. 11(A–D) is a timing chart showing an operation of the liquid crystal display apparatus shown in FIG. 9.

DETAILED DESCRIPTION OF PREFERRED EMBODIMENTS

The following describes a piezoelectric transformer, a driver circuit for the piezoelectric transformer, and a liquid crystal display apparatus incorporating the piezoelectric transformer and the driver circuit, according to various preferred embodiments of the present invention.

First, a piezoelectric transformer according to a first preferred embodiment of the present invention will be described with reference to FIGS. 1 to 8.

Figure 1:
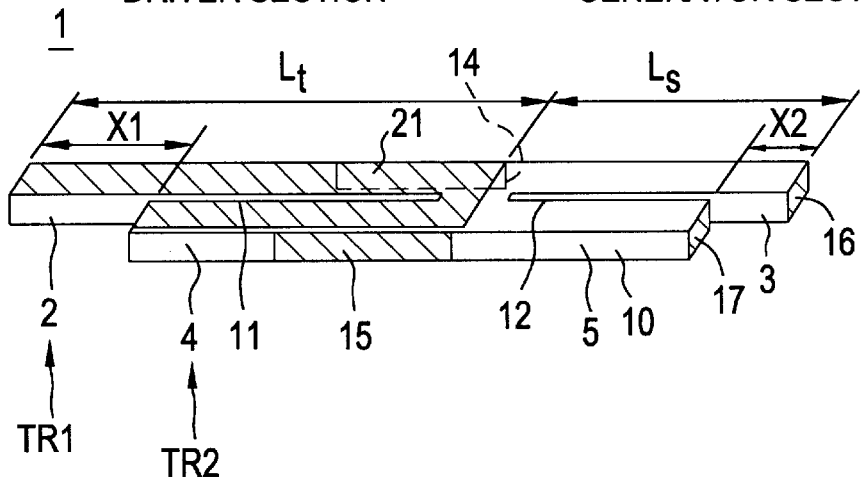
FIG. 1 is an external perspective view of a piezoelectric transformer according to a first preferred embodiment of the present invention.
Figure 2:
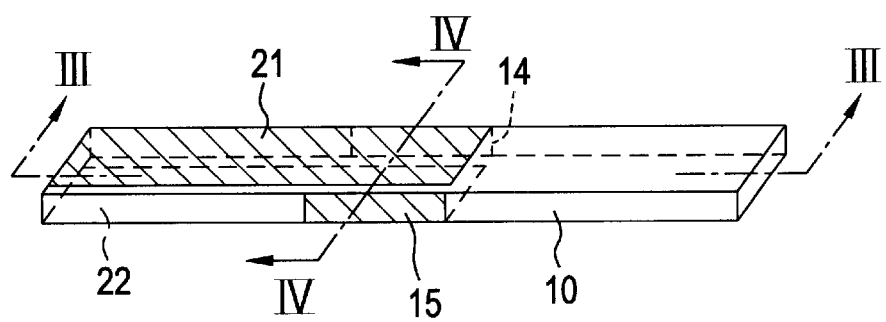
FIG. 2 is a perspective view of a piezoelectric unit which is incorporated, after subsequent manufacturing processes, in the piezoelectric transformer shown in FIG. 1.
Figure 3:
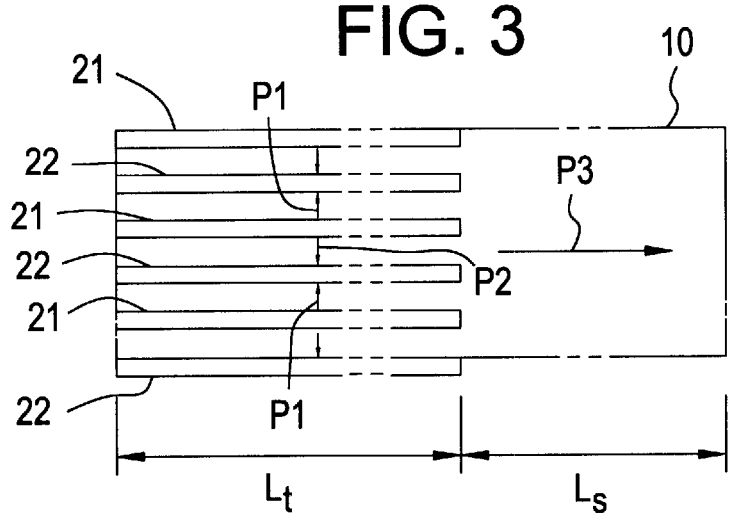
FIG. 3 is a sectional view taken along the line III—III in FIG. 2.
Figure 4:
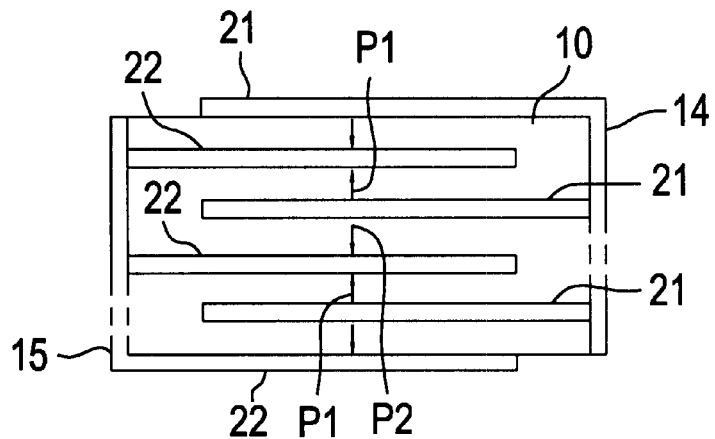
FIG. 4 is a sectional view taken along the line IV—IV in FIG. 2.

FIG. 1 is an external perspective view of the piezoelectric transformer according to the first preferred embodiment. The piezoelectric transformer 1 is preferably a Rosen type transformer, and includes a piezoelectric unit 10. The piezoelectric unit 10 includes a laminated body having ceramic green sheets that have been press-bonded, sintered, cut into a substantially rectangular shape, and polished. Typically, each of the greensheets is preferably made of lead zirconate titanate, and is formed by a doctor blade process or other suitable process. On the surfaces of the greensheets, hot electrodes 21 and ground electrodes 22 are formed as shown in FIGS. 2 to 4, for example, by screen printing or other suitable process. The piezoelectric unit 10 is polarized in the directions P1, P2, and P3, as shown in FIGS. 3 and 4. On the piezoelectric unit 10, an external input electrode 14 and an external ground electrode 15 are disposed, as shown in FIGS. 2 and 4. The external input electrode 14 and the external ground electrode 15 are formed, for example, by firing with silver, or by other suitable process. The external input electrode 14 is connected to the hot electrodes 21, and the external ground electrode 15 is connected to the ground electrodes 22.

Substantially the left half of the piezoelectric unit 10 defines a primary side, i.e., a driver section, and substantially the right half of the piezoelectric unit 10 defines a secondary side, i.e., a generator section. As shown in FIG. 1, the driver section is divided into two driver units 2 and 4 by a groove 11 extending in the longitudinal direction of the piezoelectric unit 10 from the left end thereof. Similarly, the generator section is divided into two generator units 3 and 5 by a groove 12 extending in the longitudinal direction of the piezoelectric unit 10 from the right end thereof.

Compared with the driver unit 2 and the generator unit 3, respectively, the driver unit 4 and the generator unit 5 are respectively made shorter by a predetermined length at the open ends thereof. On the open ends of the generator units 3 and 5, external output electrodes 16 and 17 are provided, respectively. The opposing pair of the driver unit 2 and the generator unit 3 constitutes a first transformer unit TR1, and the other opposing pair of the driver unit 4 and the generator unit 5 constitutes a second transformer unit TR2. The first transformer unit TR1 and the second transformer unit TR2 differ in length in the longitudinal direction. In this preferred embodiment, the piezoelectric unit 10 preferably includes, for example, thirteen ceramic greensheets, has a length of approximately 30 mm, a width of about 6 mm, a thickness of about 2.1 mm, and a ratio of approximately 6:4 between the length Lt of the driver section and the length Ls of the generator section. The length of the groove 11 is preferably, for example, about 16 mm, and the length of the groove 12 is about 10 mm. The driver unit 4 and the generator unit 5 are made shorter by approximate lengths X1=4 mm and X2=3 mm compared with the driver unit 2 and the generator unit 3, respectively.

Next, the operation of the piezoelectric transformer 1 having the above-described construction will be described when two cold-cathode tubes 34 and 35 are connected thereto. In this example, a high-frequency generator 33 is connected between the external input electrode 14 and the external ground electrode 15 of the piezoelectric transformer 1. The cold-cathode tubes 34 and 35 are connected between the external output electrodes 16 and 17 and the external ground electrode 15, respectively.

Figure 5:
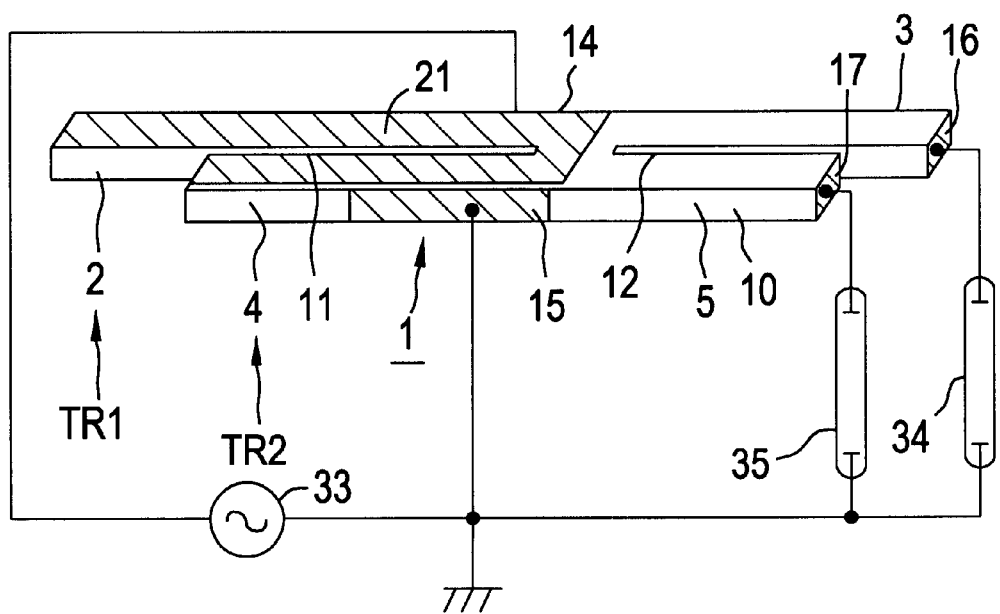
FIG. 5 is an electric circuit diagram which explains the operation of the piezoelectric transformer shown in FIG. 1.
Figure 6:
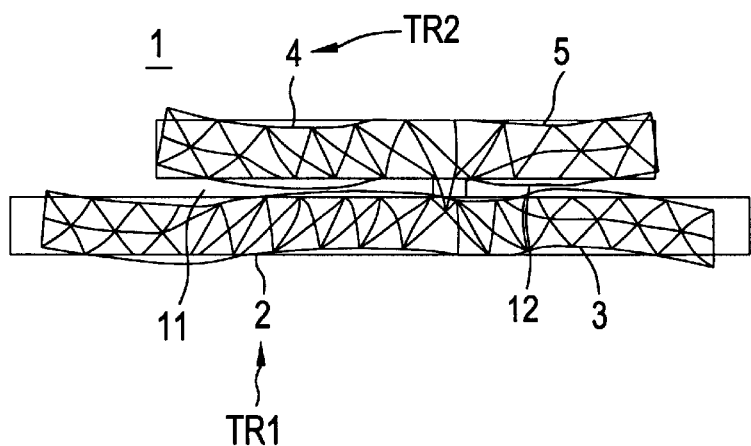
FIG. 6 is a schematic illustration showing the result of a vibration analysis, in which a drive voltage having a frequency that is substantially equal to the resonant frequency of a first transformer unit TR1 is applied to the piezoelectric transformer shown in FIG. 1.

When an AC voltage having a frequency f1 (approximately 58 kHz in this preferred embodiment) that is substantially equal to the natural longitudinal resonant frequency of the first transformer unit TR1 is generated by the high-frequency generator 33 between the external input electrode 14 and the external ground electrode 15 of the piezoelectric transformer 1, the first transformer unit TR1 longitudinally vibrates in the primary mode. FIG. 6 shows a result of a finite-element analysis on the vibration of the piezoelectric transformer 1. As shown in FIG. 6, the first transformer unit TR1 vibrates with a significant magnitude, while the second transformer unit TR2 vibrates much less. In FIG. 6, the piezoelectric transformer 1 shown in FIG. 5 is viewed from the bottom. The generator unit 3 of the first transformer unit TR1 generates a charge due to the piezoelectric effect, generating a high output voltage on the external output electrode 16, thereby turning on the cold-cathode tube 34.

Because the second transformer unit TR2 is made shorter than the first transformer unit TR1, the natural longitudinal resonant frequency of the second transformer unit TR2 is higher than that of the first transformer unit TR1. Thus, the second transformer unit TR2 vibrates only slightly, not generating an output voltage on the external output electrode 17, and thus, the cold-cathode tube 35 is not turned on.

Figure 7:
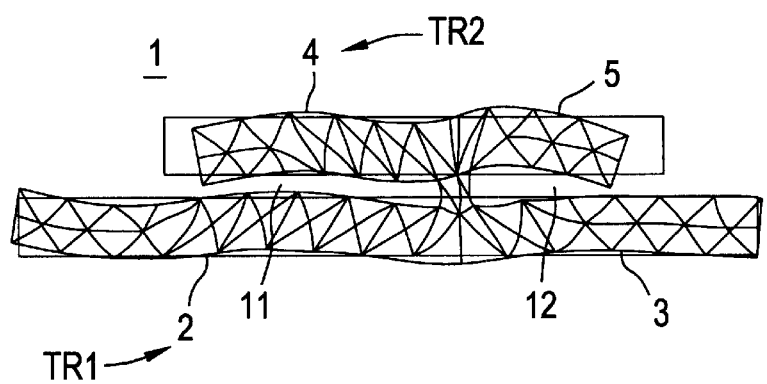
FIG. 7 is a schematic illustration showing the result of a vibration analysis, in which a drive voltage having a frequency that is substantially equal to the resonant frequency of a second transformer unit TR2 is applied to the piezoelectric transformer shown in FIG. 1.

When an AC voltage having a frequency f2 (approximately 76 kHz in this preferred embodiment) that is substantially equal to the natural longitudinal resonant frequency of the second transformer unit TR2 is generated by the high-frequency generator 33 between the external input electrode 14 and the external ground electrode 15 of the piezoelectric transformer 1, the second transformer unit TR2 longitudinally vibrates in the primary mode. FIG. 7 shows a result of a finite-element analysis on the vibration of the piezoelectric transformer 1. As shown in FIG. 7, the second transformer unit TR2 vibrates with a significant magnitude, while the first transformer unit TR1 vibrates much less. The generator unit 5 of the second transformer unit TR2 generates a charge due to the piezoelectric effect, generating a high output voltage on the external output electrode 17 and thereby turning on the cold-cathode tube 35. The first transformer unit TR1 vibrates only slightly, not generating an output voltage on the external output electrode 16, and thus, the cold-cathode tube 34 is not turned on.

Figure 8:
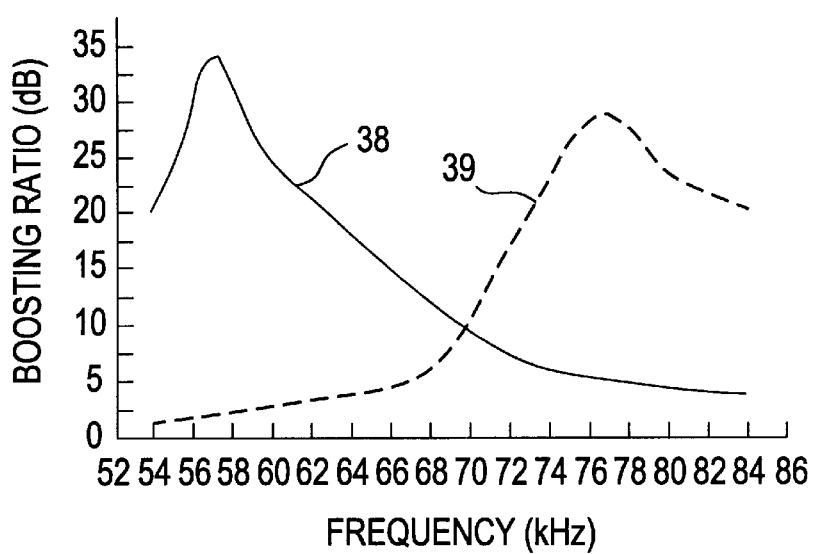
FIG. 8 is a graph showing the boosting ratio versus frequency characteristics of the piezoelectric transformer shown in FIG. 1.

As described above, in the piezoelectric transformer 1, the first transformer unit TR1 and the second transformer unit TR2 have different lengths with respect to the longitudinal direction, and therefore, have different longitudinal resonant frequencies. Generally, the boosting ratio of a piezoelectric transformer is maximum at the resonant frequency thereof. Thus, the cold-cathode tube 34 or 35 connected to the piezoelectric transformer 1 is turned on when the frequency of a voltage applied to the piezoelectric transformer is near the resonant frequency. Because the first transformer unit TR1 and the second transformer unit TR2 each have different resonant frequencies, the cold-cathode tubes 34 and 35 are respectively turned on at different frequencies. Thus, the cold-cathode tubes can be alternately turned on as desired by switching the frequency of the AC voltage supplied from the high-frequency generator 33. FIG. 8 is a graph showing boosting ratio characteristics of the first transformer unit TR1 (the solid line 38) and of the second transformer unit TR2 (the dotted line 39). As shown in FIG. 8, the boosting ratio of the first transformer unit TR1 is maximum at a frequency of approximately 58 kHz, and the boosting ratio of the second transformer unit TR2 is maximum at a frequency of approximately 76 kHz.

A liquid crystal display apparatus according to a second preferred embodiment of the present invention will be described with reference to FIGS. 9 to 11.

Figure 9:
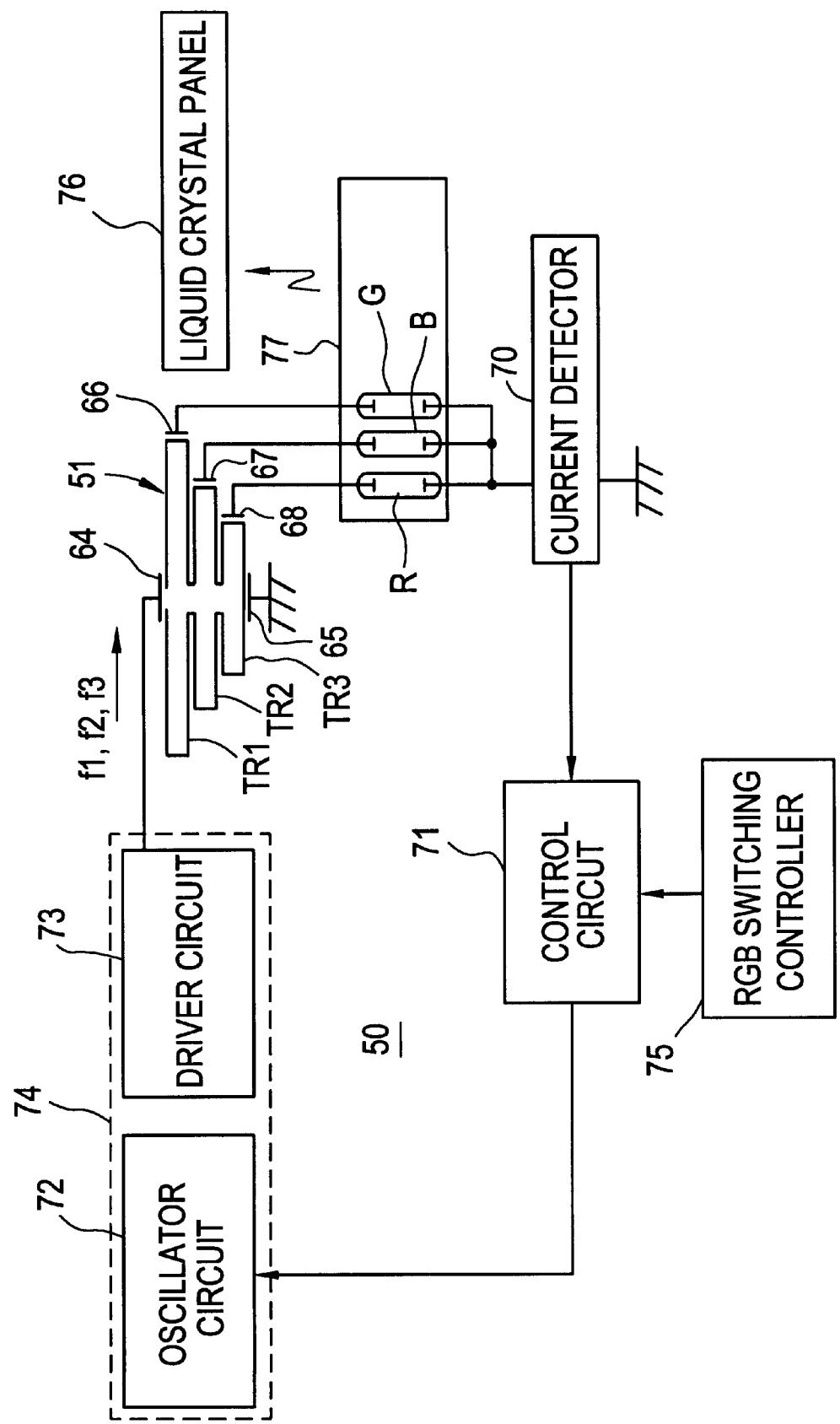
FIG. 9 is a block electric circuit diagram of a liquid crystal display apparatus according to a second preferred embodiment of the present invention.

Referring to FIG. 9, a color liquid crystal display apparatus 50 preferably includes a liquid crystal panel 76, a backlight 77, a high-frequency generator 74, a piezoelectric transformer 51, a control circuit 71, an RGB switching controller 75, and a current detector 70.

The liquid crystal panel 76 is of a known type, in which liquid crystals typically of the super-twisted nematic (STN) type are sealed between a pair of glass substrates and are arranged to define a matrix of cells. The liquid crystal cells are turned on and off via transparent electrodes, typically composed of indium tin oxide (ITO), which define the matrix of cells. The liquid crystal panel 76 has a very simple structure that does not include any color filters or thin-film transistors.

The backlight 77 includes three cold-cathode tubes G, B, and R. The cold cathode tubes G, B, and R allow color display by phosphors coated on the inner surfaces thereof emitting light components in the three primary colors, green (G), blue (B), and red (R), respectively, which eliminates the need for color filters in the liquid crystal panel 76. The cold-cathode tubes G, B, and R are periodically turned on and off so as to emit pulses of light in synchronization with the drive timing of the liquid crystal panel 76.

The high-frequency signal generator 74 includes an oscillator circuit 72 for generating an AC voltage having a predetermined frequency, and a driver circuit 73 for amplifying the AC voltage output from the oscillator circuit 72.

The piezoelectric transformer 51 is preferably a Rosen type transformer having the same construction as the piezoelectric transformer 1 in the first preferred embodiment shown in FIG. 1. More specifically, the piezoelectric transformer 51 preferably includes a piezoelectric unit 62. The piezoelectric unit 62 preferably includes a laminated body having a plurality of ceramic green sheets that have been press-bonded, sintered, cut into a substantially rectangular shape, and polished. On the surfaces of the greensheets, hot electrodes 21 and ground electrodes 22 are provided. Referring to FIG. 10, the piezoelectric unit 62 includes a primary side, i.e., a driver section, and a secondary side, i.e., a generator section. The driver section is divided into three driver units 52, 54, and 56 by two grooves 58 and 59 extending in the longitudinal direction of the piezoelectric unit 62 from the left end thereof. Similarly, the generator section is divided into three generator units 53, 55, and 57 by two grooves 60 and 61 extending in the longitudinal direction of the piezoelectric unit 62 from the right end thereof.

Compared with the driver unit 52 and the generator unit 53, the driver unit 54 and the generator unit 55, respectively, are shorter, and the driver unit 56 and the generator unit 57, respectively, are even shorter from the open ends thereof, by predetermined lengths. An external input electrode 64 and an external ground electrode 65 are arranged respectively on the side surfaces at the back and at the front, as viewed in FIG. 10, and external output electrodes 66, 67, and 68 are respectively disposed on the open ends of the generator units 53, 55, and 57.

The driver unit 52 and the generator unit 53, opposing each other, constitute a first transformer unit TR1, the driver unit 54 and the generator unit 55 constitute a second transformer unit TR2, and the driver unit 56 and the generator unit 57 constitute a third transformer unit TR3. The transformer units TR1, TR2, and TR3 differ from one another in length in the longitudinal direction, and thus, the transformer units TR1, TR2, and TR3 each have different resonant frequencies.

In the piezoelectric transformer 51, the high-frequency generator 74 is electrically connected to the external input electrode 64, the external ground electrode 65 is grounded, and the external output electrodes 66, 67, and 68 are electrically connected to the cold-cathode tubes G, B, and R, respectively, of the backlight 77.

Next, the operation of the liquid crystal color display 50 will be described. The RGB switching controller 75 alternately outputs to the control circuit 71 signals of three different levels V1, V2, and V3, as shown in part (A) of FIG. 11, in synchronization with the drive timing of the liquid crystal panel 76. The control circuit 71 outputs to the high-frequency generator 74 control signals in accordance with the input signal levels, V1, V2, or V3, so that the high-frequency generator 74 generates AC voltages having frequencies respectively corresponding to the signal levels V1, V2, and V3. More specifically, when a signal of the level V1 is input, the control circuit 71 outputs a control signal corresponding to the signal level V1, so that the high-frequency generator 74 generates an AC voltage having a frequency f1 that is substantially equal to the natural longitudinal resonant frequency of the third transformer unit TR3. When a signal of the signal level V2 is input, the control circuit 71 outputs a control signal corresponding to the signal level V2, so that the high-frequency generator 74 generates an AC voltage having a frequency f2 that is substantially equal to the natural longitudinal resonant frequency of the first transformer unit TR1. When a signal of the third input level V3 is input, the control circuit 71 outputs a control signal corresponding to the signal level V3, so that the high-frequency generator 74 generates an AC voltage having a frequency f3 that is substantially equal to the natural longitudinal resonant frequency of the second transformer unit TR2.

Thus, the high-frequency generator 74, in accordance with the control signals from the control circuit 71, alternately generates AC voltages of three different frequencies. The AC voltages are sequentially applied to the piezoelectric transformer 51. When an AC voltage having the frequency f1 that is substantially equal to the natural longitudinal resonant frequency of the third transformer unit TR3 is applied to the piezoelectric transformer 51, a high output voltage appears on the external output electrode 68, turning on the cold-cathode tube R, as shown in part (B) of FIG. 11. Because the natural longitudinal resonant frequencies of the transformer units TR1 and TR2 are different from the frequency f1, the cold-cathode tubes G and B are not turned on, as shown in parts (C) and (D) of FIG. 11.

When an AC voltage having the frequency f2 that is substantially equal to the natural longitudinal resonant frequency of the first transformer unit TR1 is applied to the piezoelectric transformer 51, a high output voltage appears on the external output electrode 66, turning on the cold-cathode tube G, as shown in part (C) of FIG. 11. Because the natural longitudinal resonant frequencies of the transformer units TR2 and TR3 are different from the frequency f2, the cold-cathode tubes R and B are not turned on, as shown in parts (B) and (D) of FIG. 11.

When an AC voltage having the frequency f3 that is substantially equal to the natural longitudinal resonant frequency of the second transformer unit TR2 is applied to the piezoelectric transformer 51, a high output voltage appears on the external output electrode 67, turning on the cold-cathode tube B, as shown in part (D) of FIG. 11. Because the natural longitudinal resonant frequencies of the transformer units TR1 and TR3 are different from the frequency f3, the cold-cathode tubes R and G are not turned on, as shown in parts (B) and (C) of FIG. 11.

Thus, the cold-cathode tubes R, G, and B are alternately turned on in synchronization with the drive timing of the liquid crystal panel 76.

While the cold-cathode tubes R, G, and B of the backlight 77 are emitting pulses of light in rapid succession, the liquid crystal panel 76 is driven so that the liquid crystal cells thereof are "opened" and "closed" as desired in synchronization with the pulses of light. If a liquid crystal cell is open when a light pulse of a particular color is emitted, the liquid crystal cell transmits the light pulse, achieving display in that color. If the liquid crystal cell is continuously "open" for light pulses of more than two colors, the light pulses of different colors are mixed when viewed. For example, if the liquid crystal cell is open for a red light pulse emitted from the cold-cathode tube R and a green light pulse emitted from the cold-cathode tube G, the red light pulse and the green light pulse are mixed to be viewed as yellow. If the cell remains open for a sequence of a red light pulse, a green light pulse, and a blue light pulse, the light pulses of the three colors are mixed to be viewed as white. The colors are mixed in the eyes because the cycle time of the light pulses of the three colors is much shorter than the time afterimages remain. White adjustment is achieved by detecting output currents of the cold-cathode tubes R, G, and B in the current detector shown in FIG. 9, and based thereon, controlling the ratio of the amounts of light (i.e., luminance) from the cold-cathode tubes R, G, and B in the control circuit 71.

The color liquid crystal display apparatus 50 having the above-described construction requires only one inverter as opposed to three in the conventional liquid crystal display apparatus, and thus has a much smaller size and much lower cost.

It is to be appreciated that the present invention is not limited to the above-described preferred embodiments, and that various modifications can be made within the gist of the present invention. For example, although in the first preferred embodiment, the external electrode 14 is used as an external input electrode and the external electrode 15 is used as an external ground electrode, conversely, the arrangement may be such that the external electrode 14 is used as an external ground electrode and the external electrode 15 is used as an external input electrode. Also, the polarization of the generator units 3 and 5 of the piezoelectric transformer 1 may be in directions opposite from the first preferred embodiment.

While preferred embodiments of the invention have been disclosed, various modes of carrying out the principles disclosed herein are contemplated as being within the scope of the following claims. Therefore, it is understood that the scope of the present invention is not to be limited except as otherwise set forth in the claims.

What is claimed is:
1. A piezoelectric transformer comprising:
   a piezoelectric unit including:
      a plurality of driver units divided by at least one groove extending in the longitudinal direction of said piezoelectric unit from one end thereof; and
      a plurality of generator units, opposing said plurality of driver units, divided by at least one groove extending in the longitudinal direction of said piezoelectric unit from the other end thereof;
      wherein opposing pairs of the driver units and the generator units constitute a plurality of transformer units, and the transformer units differ in length from one another.

2. A piezoelectric transformer according to claim 1, wherein the transformer is a Rosen type transformer.

3. A piezoelectric transformer according to claim 1, wherein the piezoelectric unit comprises a laminated body having ceramic green sheets that have been press-bonded, sintered, cut into a substantially rectangular shape, and polished.

4. A piezoelectric transformer according to claim 1, wherein the piezoelectric unit comprises a driver section including the plurality of driver units and a generator section including the plurality of generator units.

5. A piezoelectric transformer according to claim 1, wherein the transformer units have different natural longitudinal resonant frequencies.

6. A piezoelectric transformer according to claim 1, wherein three of the plurality of transformer units are provided and each have different lengths and resonant frequencies.

7. A driver circuit for driving a plurality of light sources, said driver circuit comprising:
   a piezoelectric transformer according to claim 1, in which said plurality of transformer units correspond to said plurality of light sources; and
   a high-frequency generator arranged to apply to said piezoelectric transformer a plurality of drive voltages each having a frequency that is substantially equal to the natural longitudinal resonant frequency of one of said plurality of transformer units.

8. The driver circuit according to claim 7, wherein the transformer is a Rosen type transformer.

9. The driver circuit according to claim 7, wherein the piezoelectric unit includes a laminated body having ceramic green sheets that have been press-bonded, sintered, cut into a substantially rectangular shape, and polished.

10. The drive circuit according to claim 7, wherein the piezoelectric unit includes a driver section including the plurality of driver units and a generator section including the plurality of generator units.

11. The driver circuit according to claim 7, wherein the transformer units have different natural longitudinal resonant frequencies.

12. The driver circuit according to claim 7, wherein three of the plurality of transformer units are provided and each have different lengths and resonant frequencies.

13. A liquid crystal display apparatus comprising:
   a driver circuit according to claim 7; and
   the plurality of light sources driven by said driver circuit.

14. The liquid crystal display apparatus according to claim 13, wherein the liquid crystal display apparatus includes only one inverter.

15. The liquid crystal display apparatus according to claim 13, further comprising a liquid crystal panel, a backlight, a high-frequency generator, a piezoelectric transformer, a control circuit, an RGB switching controller, and a current detector.

16. The liquid crystal display apparatus, according to claim 13, further comprising super-twisted nematic liquid crystals sealed between a pair of glass substrates.

* * * * *